(12) United States Patent
Wright et al.

(10) Patent No.: US 6,771,071 B1
(45) Date of Patent: Aug. 3, 2004

(54) MAGNETIC RESONANCE IMAGING USING A REDUCED NUMBER OF ECHO ACQUISITIONS

(75) Inventors: Steven M. Wright, College Station, TX (US); David Gerald Brown, College Station, TX (US); Mary Preston McDougall, College Station, TX (US)

(73) Assignee: The Texas A&M University System, College Station, TX (US)

( * ) Notice: Subject to any disclaimer, the term of this patent is extended or adjusted under 35 U.S.C. 154(b) by 0 days.

(21) Appl. No.: 10/289,522

(22) Filed: Nov. 6, 2002

Related U.S. Application Data

(60) Provisional application No. 60/348,154, filed on Nov. 6, 2001, and provisional application No. 60/346,045, filed on Nov. 6, 2001.

(51) Int. Cl.[7] .................................................. G01V 3/00
(52) U.S. Cl. ...................... 324/318; 324/322; 600/421
(58) Field of Search ................................ 324/309, 307, 324/318, 322, 306, 314; 600/421, 422

(56) References Cited

U.S. PATENT DOCUMENTS

| | | | | |
|---|---|---|---|---|
| 4,857,846 A | * | 8/1989 | Carlson | 324/309 |
| 5,086,275 A | * | 2/1992 | Roemer | 324/309 |
| 6,104,943 A | * | 8/2000 | Frederick et al. | 600/410 |

OTHER PUBLICATIONS

Griswold Mark A., Peter M. Jakob, Mathias Nittka, James W. Goldfarb, Axel Haase; "*Partially Parallel Imaging With Localized Sensitivities (Pils)*", Proc. Intl. Soc. Mag. Reson. Med. 8, (p. 273), 2000.

Ray F. Lee, J. Charles R. Westgate., Robert G. Weiss, Paul A. Bottomley; "*Planar Strip Array Antenna for Parallel Spatial Encoded MRI*", Proc. Intl. Soc. Mag. Reson. Med. 8, (p. 558), 2000.

Ray F. Lee, J. Charles R. Westgate., Robert G. Weiss, Paul A. Bottomley; "*Planar Strip Array (PSA) for MRI*", Proc. Intl. Soc. Mag. Reson. Med. 8, (p. 558), 2001.

Michael Hutchinson and Ulrich Raff; "*Fast MRI Data Acquisition Using Multiple Detectors*", Mag. Reson. Med. vol. 6, (pp. 87–91), 1998.

(List continued on next page.)

*Primary Examiner*—Louis Arana
(74) *Attorney, Agent, or Firm*—Baker Botts L.L.P.

(57) ABSTRACT

According to one embodiment of the invention, an apparatus for magnetic resonance imaging is provided. The apparatus includes a detection surface defined by a plurality of sensors. Each of the sensors is operable to receive image information concerning a particular portion of a target surface by substantially confining to the each of the sensors magnetic flux associated with the particular portion of the target surface. The detection surface is operable to acquire all image information for generating a magnetic resonance image resembling the target surface by receiving, at the each of the sensors, a single echo signal from the particular portion of the target surface that correspondingly underlies the each of the sensors. The magnetic resonance image has a resolution of at least sixty-four pixels by a number of pixels equal to M. M is an integer.

31 Claims, 5 Drawing Sheets

OTHER PUBLICATIONS

James R. Kelton, Richard L. Magin, Steven M. Wright; "*An Algorithm For Rapid Image Acquisition Using Multiple Receiver Coils*", In: Works in Progress, Eighth Annual Meeting and Exhibition of the SMRM, Amsterdam: Societyof Magnetic Resonance in Medicine (p. 1172), 1989.

J.W. Carlson, T. Minemura; "*Imaging Time Reduction through Multiple Receiver Coil Data Acquisition and Image Reconstruction*", Mag. Reson. Med. vol. 29, (pp. 681–688), 1993.

Klaas P. Preuessmann, Markus Weiger, Markus B. Scheidegger, Peter Boesiger, "*Coil Sensitivity Maps for Sensitivity Encoding and Intensity Correction*", In: Proceedings of the Sixth Scientific Meeting of the ISMRM, Sydney: International Society for Magnetic Resonance in Medicine (p. 579), 1998.

Daniel K. Sodickson, Mark A. Griswold, Peter M. Jakob, Robert R. Edelman, Warren J. Manning; "*Signal–to–Noise Ratio and Signal–to–Noise Efficiency in SMASH Imaging*", Mag. Reson. Med. vol. 41, (pp. 1009–1022), 1999.

P.B. Eoemer, W.A. Edelstein, C.E. Hayes, S.P. Souza, O.M. Mueller, "*The NMR Phased Array*", Mag. Reson. Med. vol. 16, (pp. 192–225), 1990.

Jay R. Porter, Steven M. Wright, Nader Famili, "*A Four–Channel Time Domain Multiplexer: A Cost–Effective Alternative to Multiple Receivers*", Mag. Reson. Med. vol. 32, (pp. 499–504), 1994.

Jay R. Porter, Steven M. Wright, Arne Reykowski, "*A 16–Element Phased–Array Head Coil*", Magnetic Resonance in Medicine, vol. 40, (pp. 272–279), 1998.

Steven M. Wright, Lawrence L. Wald, "*Theory and Application of Array Coils in MR Spectroscopy*", NMR in Biomedicine, vol. 10, (pp. 394–410), 1997.

S.W. Wright, J.R. Porter, "*Parallel Acquisition of MR Images using Time Multiplexed Coils*", Electronic Letters (pp. 71–72, vol. 28, No. 1), Jan. 2, 1992.

Steven M. Wright, Richard L. Magin, James R. Kelton, "*Arrays of Mutually Coupled Receiver Coils: Theory and Application*", Magnetic Resonance in Medicine, vol. 17, No. 1 (pp. 252–268), Jan. 1999.

\* cited by examiner

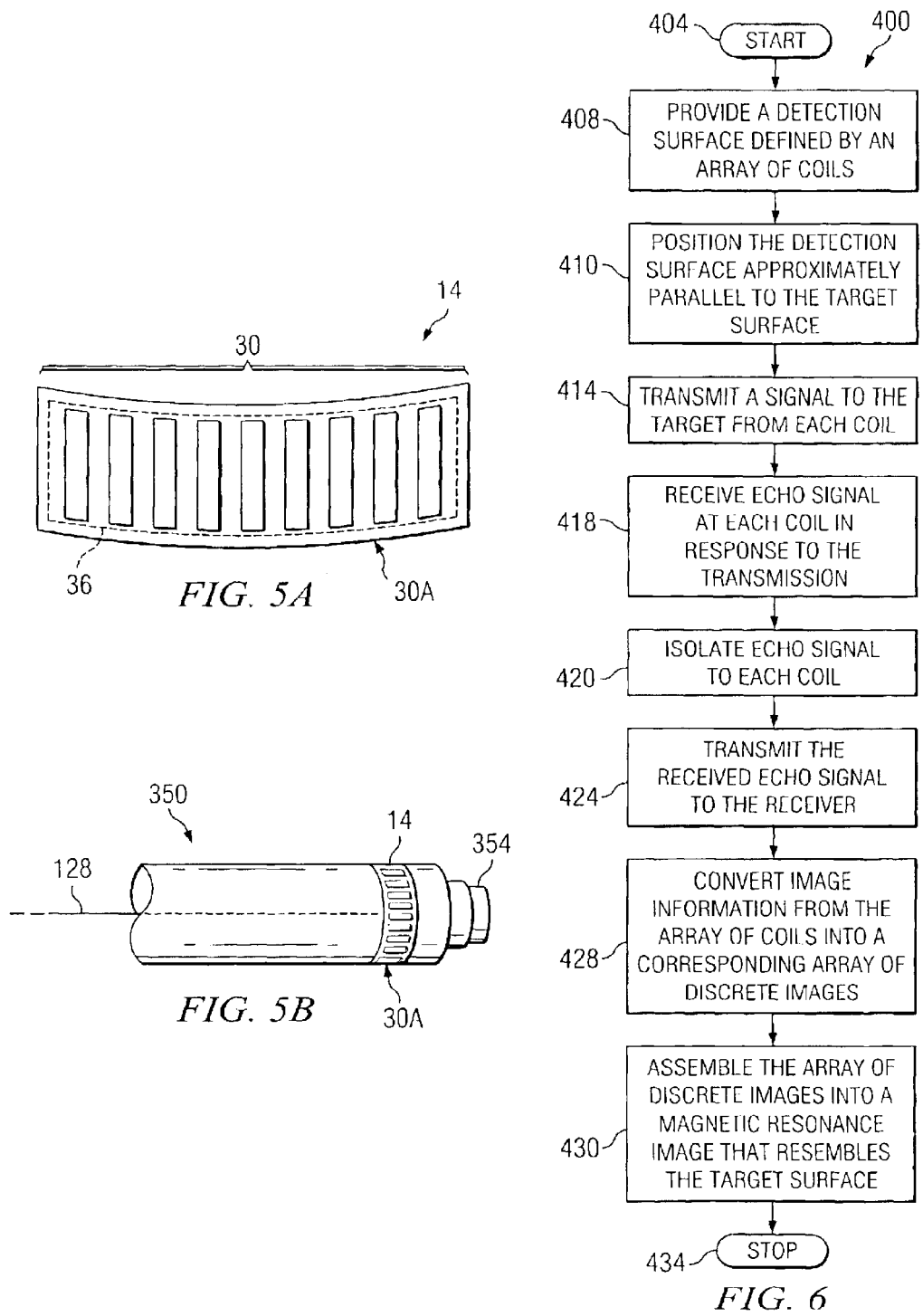

MAGNETIC RESONANCE IMAGING USING A REDUCED NUMBER OF ECHO ACQUISITIONS

RELATED APPLICATIONS

This application claims the benefit under 35 U.S.C. §119 (e) of the filing date of U.S. Provisional Application Serial No. 60/348,154, filed Nov. 6, 2001 entitled Radio-Frequency Encoding (RFE) Probes For Magnetic Resonance Imaging, and U.S. Provisional Application Serial No. 60/346,045, filed Nov. 6, 2001 entitled Receiver For Detecting Signals From An Array Of Sensors In Magnetic Resonance Imaging And Spectroscopy.

GOVERNMENT RIGHTS

This invention was made with Government support under U.S. Army Grant No. DAMD 17-97-2-7016. The government has certain rights in this invention.

TECHNICAL FIELD OF THE INVENTION

This invention relates generally to the field of imagery and more particularly to magnetic resonance imaging using a reduced number of echo acquisitions.

BACKGROUND OF THE INVENTION

Magnetic Resonance Imaging ("MRI") is a widely used imaging technique. For example, MRI may be used to obtain an image of a patient's tumor, lesion, or other internal feature without performing invasive medical procedures. Recent advances in MRI make possible new medical procedures, such as magnetic resonance guided intervention procedures and patient interactive diagnosis. However, the practical application of these procedures using MRI has been limited because of slow imaging speed.

Imaging speed depends on the number of sensors used to acquire image information and the time required to perform a required repetition of scans to produce an image of acceptable resolution. A number of different MRI techniques have been developed to improve imaging speed by increasing the number of sensors and/or reducing the time of scan repetition by increasing the rate of scan. However, the points to which these measures may be taken to improve the overall imaging speed are limited for a number of reasons. For example, as the number of sensors increases, the difficulty of decoupling the sensors from one another for independent data collection also increases. Up to sixteen sensors may have been successfully used to simultaneously acquire image information. As the scan rate is increased, the probability of bio-hazards, such as unintended neural stimulation and patient heating due to the pulse power of the radio frequency signal, may also increase. These limitations have hindered further improvement of imaging speed for MRI.

SUMMARY OF THE INVENTION

According to one embodiment of the invention, an apparatus for magnetic resonance imaging is provided. The apparatus includes a detection surface defined by a plurality of sensors. Each of the sensors is operable to receive image information concerning a particular portion of a target surface by substantially confining to the each of the sensors magnetic flux associated with the particular portion of the target surface. The detection surface is operable to acquire all image information for generating a magnetic resonance image resembling the target surface by receiving, at the each of the sensors, a single echo signal from the particular portion of the target surface that correspondingly underlies the each of the sensors. The magnetic resonance image has a resolution of at least sixty-four pixels by a number of pixels equal to M. M is an integer.

Some embodiments of the invention provide numerous technical advantages. Some embodiments may benefit from some, none, or all of these advantages. For example, according to one embodiment, an acceptable magnetic resonance image may be produced using fewer number of scans by employing a number of sensors equal to one dimension of the image resolution that is deemed acceptable for a particular use. In another embodiment, an image of a surface that is parallel to a detection surface may be obtained by arranging sixty-four or more sensors side-by-side to define a detection surface that is approximately parallel to a target surface. In another embodiment, an image having an acceptable resolution may be generated using only a single echo signal acquisition by arranging sixty-four or more decoupled sensors in an array to define a detection surface.

Other technical advantages may be readily ascertained by one of skill in the art.

BRIEF DESCRIPTION OF THE DRAWINGS

Reference is now made to the following description taken in conjunction with the accompanying drawings, wherein like reference numbers represent like parts, in which:

FIGS. 5A and 5B are perspective views illustrating some embodiments of a detection surface shown in FIG. 1; and FIG. 6 is a flowchart illustrating one embodiment of a method for MRI.

DETAILED DESCRIPTION OF EXAMPLE EMBODIMENTS OF THE INVENTION

Embodiments of the invention are best understood by referring to FIGS. 1 through 6 of the drawings, like numerals being used for like and corresponding parts of the various drawings.

Figure 1:
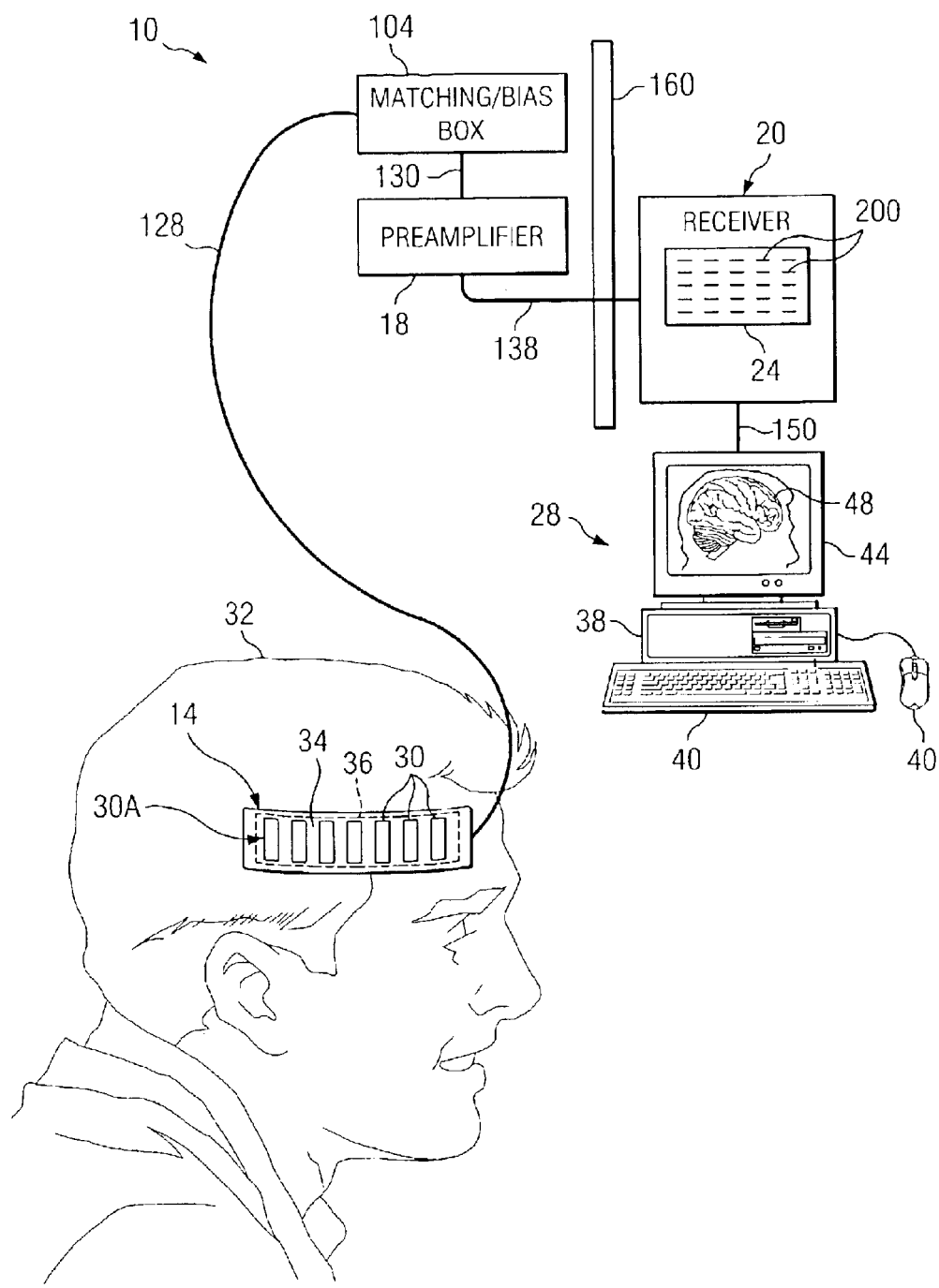
FIG. 1 is a schematic diagram illustrating one embodiment of a magnetic resonance imaging ("MRI") system that may benefit from the teachings of the present invention.

FIG. 1 illustrates one embodiment of a magnetic resonance imaging ("MRI") system 10 that may benefit from the teachings of the present invention. System 10 comprises a sensor system 14, a matching/bias box 104, a preamplifier 18, a receiver system 20, and an image display system 28. Sensor system 14 comprises one or more sensors 30 operable to detect radio frequency ("RF") signals that echo from a surface 34 of a target 32, such as the head of a patient; however, sensors 30 are operable to detect echo signals from any other target surfaces. Receiver system 20 comprises a bank 24 of one or more channels 200 that are operable to receive the signals transmitted by respective sensors 30 in sensor system 14. Image display system 28 comprises a computer 38, one or more input devices 40, and one or more output device 44 that are operable to display an MRI image 48. Output device 44 may be a monitor, a printer, or any other device that allows a user to view MRI image 48. Preamplifier 18 amplifies the signals received from sensor system 14 to a level that allows receiver system 20 to process the signals so that computer 38 may digitize the signals. Matching/bias matching/bias box 104 is operable to provide a direct current ("DC") bias for varactors on sensor system 14 and perform series capacitive matching for each of the sensors on sensor system 14. "Varactors" refer to voltage controlled diodes that serve as variable capacitors tunable by a DC voltage. In place of varactors, variable capacitors may also be used, in some embodiments.

Sensor system 14 is coupled to matching/bias box 104 by a line 128. Matching/bias box 104 is coupled to preamplifier 18 by a lines 130. Preamplifier 18 is coupled to receiver system 20 by line 138. Receiver system 20 is coupled to computer 38 by line 150. Sensor system 14, matching/bias box 104, and preamplifier 18 may be separated from receiver system 20 and computer 38 by a magnet room wall 160 that shields receiver system 20 and computer 38 from the signals transmitted and received by sensor system 14.

In operation, sensor system 14 is positioned over target surface 34. Then sensors 30 of sensor system 14 transmit RF signals to target surface 34. In response, sensors 30 of sensor system 14 receive respective echo signals indicative of image information of the respective portions of target surface 34 underlying the respective sensors 30. The process of transmitting an RF signal and receiving an echo signal is referred to as a "scan" or "echo acquisition." After the scan, each of echo signal is transmitted to matching/bias box 104. Matching/bias box 104 provides a DC bias for varactors on sensor system 14 and performs series capacitive matching for each sensor 30 of sensor system 14. The processed signals are transmitted from matching/bias box 104 to preamplifier 18. Preamplifier 18 amplifies the received signals and transmits the amplified signals to receiver system 20. After receiving the amplified signals, receiver system 20 processes the amplified signals to generate an image that may be digitized and displayed by image display system 28. Image display system digitizes the image signals from receiver system 20. The digitized signals may be displayed using output unit 44 of image display system 28.

A conventional MRI system generates a magnetic resonance ("MR") image having an acceptable resolution by performing multiple echo acquisitions. An acceptable resolution of an image may be expressed as N×M, where N and M are integers indicating the number of pixels in particular directions, such as the x and the y directions on a two-dimensional plane. M is an integer that is generally an integer multiple of N; however, M may be any number. A pixel refers to a basic unit of an image, such as a dot, that forms the image. The physical dimension of a pixel depends on the particular dot pitch that is selected by one skilled in the art. Although the definition of an acceptable resolution or an acceptable image may vary depending on the particular use of the image, a resolution of 64×64 pixels is generally considered as a minimum standard of acceptable image resolution. Conventionally, multiple echo acquisitions may be performed by repeatedly transmitting RF signals in the presence of a phase encoding gradient having different amplitudes to a target surface so that a sensor system repeatedly receives different sets of echo signals indicating different sets of image information. The repetition of echo acquisition allows such a system to acquire image information for one direction (the direction associated with N, for example) of a two dimensional image by using phase encoding gradients; information for the other direction (the direction associated with M, for example) is acquired using magnetic field gradients.

To improve imaging speed, the rate of scan repetition may be increased to shorten the total time of scan repetition. However, increasing the rate of scan repetition may produce adverse physiological effects associated with repeated RF pulses and rapidly switched frequency encoding gradient. Examples of physiological effects include patient heating and neural stimulation. A number of different parallel imaging techniques, such as SMASH and SENSE, take another approach to the improvement of imaging speed by increasing the number of sensors, which decreases the number of scan repetitions required to generate an acceptable image. By using an array of up to eight sensors to simultaneously perform echo acquisition, imaging speed has been accelerated by a factor of up to eight. However, even with eight sensors, these techniques require numerous echo acquisitions to generate an image that has an acceptable resolution.

The teachings of the invention recognizes that the point to which the number of sensors may be increased is limited by the difficulties associated with decoupling the sensors from each other while positioning the sensors within a required field of view ("FOV"). FOV refers to an area defined by sensors. The area, also referred to as a "detection surface," is positioned on sensor system 14 and corresponds with the portion of the target surface that is imaged. Because sensors are positioned within a FOV having a limited size, an increased number of sensors would crowd the FOV, which increases the difficulty associated with decoupling. Thus, the use of multiple echo acquisition remains as a necessity for many MRI techniques.

According to some embodiments of the present invention, a method, apparatus, and system are provided that allow an image having an acceptable resolution to be generated using a single echo acquisition. This is advantageous in some embodiments of the invention because an acceptable MR image may be produced using a fewer number of scans by employing a number of sensors equal to one dimension of the image resolution that is deemed acceptable for a particular use. In another embodiment, an image of a surface that is parallel to a detection surface may be obtained by arranging sixty-four or more sensors side-by-side to define a detection surface that is approximately parallel to a target surface. In another embodiment, an image having an acceptable resolution may be generated using only a single echo signal acquisition by arranging sixty-four or more decoupled sensors in an array to define a detection surface. Additional details of example embodiments of the invention are described in greater detail below in conjunction with portions of FIG. 1 and FIGS. 2A through 6.

Referring back to FIG. 1, in one embodiment of the invention, a number of sensors 30 equaling N is positioned in an array 30A within a particular FOV, thus defining a detection surface 36. For example, where 64×256 resolution is acceptable, sixty-four sensors 30 may be positioned as array 30A within FOV 36. In one embodiment, N number of sensors 30 may be positioned within FOV 36 by using elongated, planar coils as sensors 30. Sensors 30 are also referred to herein as coils 30; however, any other types of sensors suitable for MRI may be used as sensor 30. In one embodiment, elongated planar coils 30 are positioned side-by-side and substantially parallel to each other to maximize the number of coils 30 within FOV 36. In one embodiment, each coil 30 is separated by a gap to enhance decoupling of each coil 30 from other coils 30. In one embodiment, a capacitor may be positioned across each gap to enhance the decoupling. In one embodiment, planar pairs may be used as coils 30. Additional details of planar coils are provided below in conjunction with FIG. 3. By placing N number of coils within FOV 36 and arranging them in array 30A, each coil 30 is essentially responsible for only one pixel of the generated image and not required to perform multiple echo acquisitions. Thus, the need to use phase encoding gradients for coil 30 to detect image information may be eliminated, which substantially reduces imaging time without adverse physiological side effects. In one embodiment, each coil 30 may be used to transmit RF signals to the respective portions of target surface 34; however, RF signals may be transmitted using other devices. For example, a transmit coil (not explicitly shown) that encompasses array 30A of coils 30 may be used to send RF signals to target surface 34.

In one embodiment, sensor system 14 may have a planar profile, allowing sensor system 14 to acquire image information from a target surface that is approximately parallel to the profile of sensor system 14. Stated in other words, any surface or cross-sectional plane of the target that is approximately parallel to detection surface 36 of sensor system 14 may be imaged. For example, if an image of a patient's brain surface is needed, then detection surface 36 of sensor system 14 may be formed as a curve having approximately the same curvature as the curvature of the brain surface. Then detection surface 36 is positioned over the portion of the brain surface that needs to be imaged so that the detection surface 36 is approximately parallel to the portion of the brain surface. In another example where an image of the inner wall of a patient's throat is needed, sensor system 14 may be formed into a cylinder having an approximately same curvature as the inner wall of the throat. Then the sensor system 14 may be inserted into the throat so that detection surface 36 is within the throat and approximately parallel to the inner wall of the throat. By positioning detection surface 36 approximately parallel to the inner wall of the throat, the inner wall of the throat may be imaged. Some embodiments of sensor system 14 having a curved profile and cylindrical profile are described below in conjunction with FIGS. 5A and 5B, respectively.

To give sensor system 14 a planar profile, coils 30 may be printed using techniques analogous to those used for manufacturing printed circuit boards. Sensors 30 may be printed on a DUPONT PYRALUX LF substrate, a flexible substrate with a thickness of less than 100 microns, in one embodiment; however, substrates having different physical dimensions that are formed from other suitable materials may also be used. DUPONT PYRALUX LF substrate is available from Dupont Corporation.

Referring again to FIG. 1, in one embodiment where N equals 64, sensor system 14 comprises array 30A of sixty-four decoupled coils 30. To accommodate the sixty-four coils 30, matching/bias box 104, preamplifier 18, receiver system 20, and data acquisition computer 38 each comprises a corresponding sixty-four channels. In some embodiments, receiver system 20 may include computer 38 as a part of receiver system 20. Receiver system 20 may also be referred to as a receiver. In some embodiments, multiple units of matching/bias boxes 104, preamplifiers 18, and receivers 20 each having less than sixty-four channels may be used to provide the respective sixty-four channels. For example, two thirty-two channel matching/bias boxes 104, two thirty-two channel preamplifiers 18, and two thirty-two channel receivers 20 may be used to provide a total of sixty-four channels, respectively. Also, two thirty-two channel analog/digital converter boards (not explicitly shown) for computer 38 may be used so that computer 38 may provide a total of sixty-four channels. Although the components 104, 18, 20, and 38 of MRI system 10 are described as configured for using sensor system 14 having sixty-four coils 30, these components 104, 18, 20, and 38 may be configured for any other number of coils 30 by including enough channels in each of matching/bias box 104, preamplifier 18, receiver system 20, and computer 38 to establish a one-to-one correspondence between each channel and each coil 30. For example, where N number of coils 30 are used, components 104, 18, 20, and 38 each has N number of channels.

In one embodiment, as shown in FIG. 1, matching/bias box 104 is a component separate from sensor system 14 to enhance the planar profile of sensor system 14 and/or reduce the cost of making sensor system 14; however, in some embodiments where sensor system 14 has the suitable circuitry for tuning, matching/bias box 104 may be omitted. In one embodiment, receiver system 20 may process signals received from coils 30 to enhance resolution, by either making one or more echo acquisitions or by accounting for the reception pattern of each loop of each coil 30 to obtain a super-resolution.

In one embodiment, line 128 is a collection of transmission lines where a particular transmission line couples a particular coil 30 of sensor system 14 to a corresponding channel of matching/bias box 104. Line 130 is a collection of transmission lines where a particular transmission line couples a particular channel of matching/bias box 104 to a corresponding channel of preamplifier 18. In one embodiment, GORE Ribbon-AX cables may be used as lines 128 and 130; however, other suitable cables may also be used. GORE Ribbon-AX cables are available from W. L. Gore corporation. Line 138 is a collection of cables where a particular transmission line couples a particular channel of preamplifier 18 to a corresponding channel of receiver system 20. In one embodiment, a bundle of RG-174 coaxial cables may be used as line 138; however, other suitable cables may be used. RG-174 coaxial cables are available from Allied Electronics corporation.

Figure 2A:
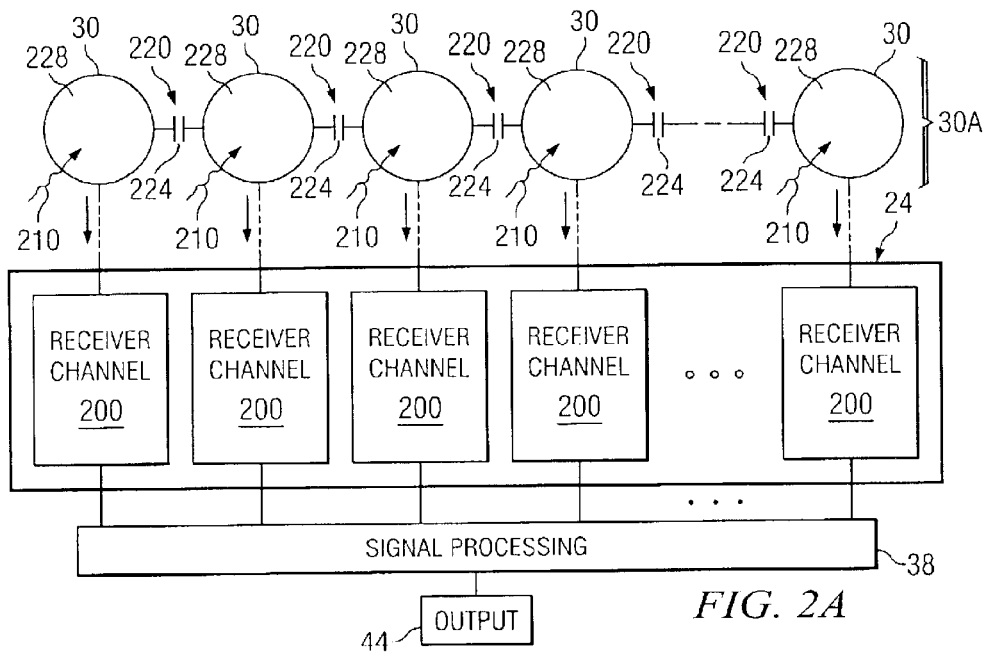
FIG. 2A is a block diagram illustrating one embodiment of an array of sensors and a corresponding array of receiver channels shown in FIG. 1.

FIG. 2A is a block diagram illustrating one embodiment of array 30A of coils 30 and channel bank 24 of FIG. 1. Coil 30 may be any suitable sensor. Each coil 30 is coupled to a particular receiver channel 200 of bank 24. Although coil 30 is shown in FIG. 2A as having one simple loop that defines an opening 228, coil 30 may comprise more than one loop. In one embodiment, a single transmission line or flat strip may be used as a loop of coil 30. In one embodiment, planar pairs may be used as coils 30. Additional details of planar pairs are described below in conjunction with FIG. 3. In one embodiment, N number of coils 30 are positioned side-by-side in array 30A. For example, as shown in FIG. 2A, simple loops of coils 30 may be positioned side-by-side so that the respective surfaces defined by openings 228 are approximately parallel to target surface 34; however, in some embodiments, simple loops of coil 30 may be positioned side-by-side so that the respective surfaces defined by openings 228 are perpendicular to target surface 34. Coil 30 may be formed from any suitable conductive material for receiving electromagnetic signals. For example, coil 30 may be formed from copper. Receiver channels 200 are coupled to computer 38 for processing and digitizing the image signals so that output unit 44 may display an MRI image, such as image 48.

To lower the probability of generating erroneous image information, each coil 30 is decoupled from other coils 30. "Decoupling", also referred to as "isolation," refers to minimizing the measure of the voltage produced at the terminals of one coil 30 due to a current in another coil 30. This parameter may be quantified as $S_{12}$. In some embodiments, $S_{12}$ is less than −20 dB; however, coils 30 may be considered as "decoupled" from each other at values as high as −15 dB. Depending on the particular design of an MRI system, other values of $S_{12}$ may also render coils 30 as sufficiently decoupled. In one embodiment, to decouple the coils 30, a gap 220 is positioned between each coil 30. In one embodiment, a capacitor 224 may be positioned across each gap 220 to further enhance the isolation of coils 30. Other suitable methods of isolation, such as the use of planar pairs as coils 30, may also be used in conjunction with coils 30. In some embodiments, gap 220 and/or capacitor 224 may be omitted.

In an illustrative operation, an electromagnetic signal 210 indicating image information of a particular portion of target surface 34 is received when signal 210 travels through opening 228 defined by a loop of coil 30. Upon receiving signal 210, the magnetic portion of the electromagnetic signal 210 generates a current indicating the image information. The current is transmitted to a corresponding receiver channel 200. Because of the isolation features, such as gap 220 and capacitor 224, only a minimal measure of voltage is produced at the terminals of other coils 30 due to the current generated at the coil 30.

Figure 2B:
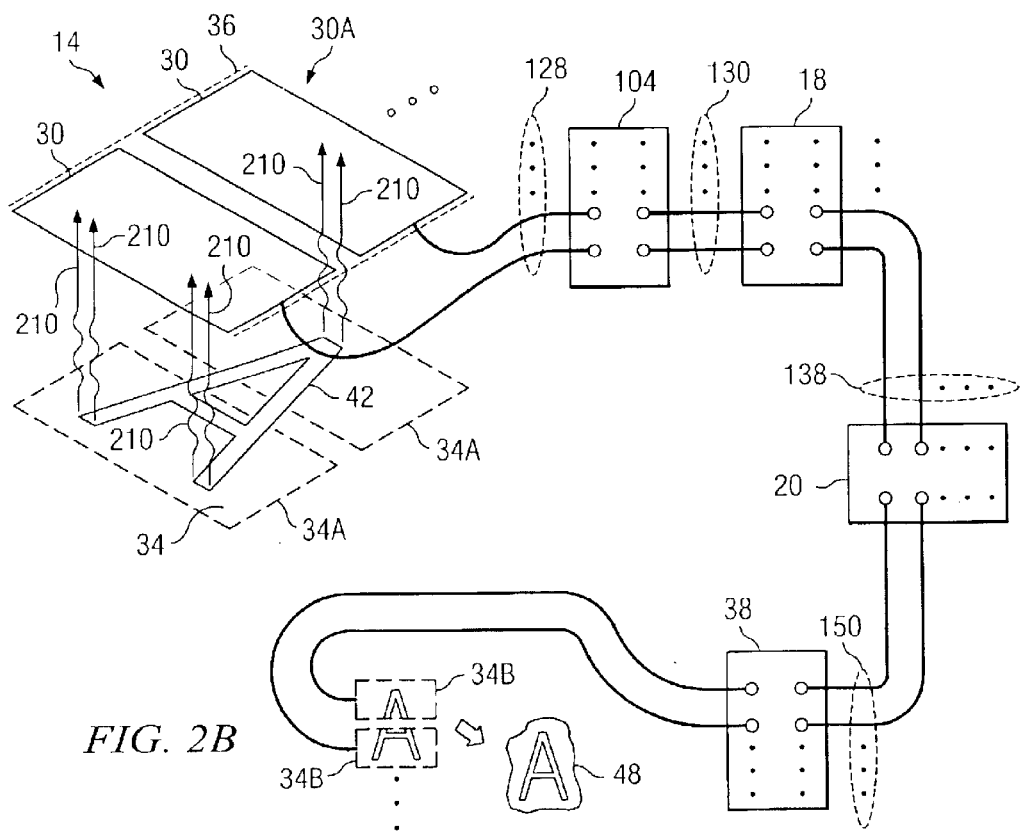
FIG. 2B is a schematic diagram illustrating exemplary operational details of the system shown in FIG. 1 and the array of sensors shown in FIG. 2A.

FIG. 2B is a schematic diagram illustrating additional operational details of sensor system 14 and system 10, shown in FIGS. 2A and 1, respectively. Only two coils 30 are shown in FIG. 2B for illustrative purposes; however, N number of coils 30 may be in array 30A to form detection surface 36. As shown in FIG. 2B, each coil 30 in array 30A is responsible for a "strip" of information corresponding to a portion 34A of target surface 34 that underlies the coil 30. For illustrative purposes, a letter "A" is shown on target surface 34 as an example feature. To receive the corresponding strip of image information, each coil 30 receives one echo signal, which is depicted as signal 210. The information along the strip may be frequency encoded in a standard manner. Then the received strips of image information from coils 30 are transmitted over their respectively corresponding transmission lines of line 128 to matching/bias box 104 for processing. Then the processed strips of information are transmitted from matching/bias box 104 to preamplifier 18 over their respectively corresponding transmission lines of line 130 for amplification. Then the amplified signals indicating the strips of information are transmitted from preamplifier 18 to receiver system 20 over their respectively corresponding transmission lines of line 138 for processing. The processed strips of information are transmitted from receiver system 20 to computer 38 over their respectively corresponding transmission lines of line 150 for digitization. Computer 38 digitizes the received strips of information from the respective coils 30 into discrete images 34B. One discrete image 34B shows the upper half of the letter "A," while the other discrete image 34B shows the lower half of the letter "A". Then computer 38 assembles the discrete images 34B into MR image 48 according to the relative order of the coils 30 in array 30A. Rather than forming discrete images 34B, some embodiments of the invention may arrange the respective image information according to the relative order of the coils 30 in array 30A, then convert all of the information at the same time into MR image 48. In these embodiments, discrete images 34B may not be formed.

Figure 3:
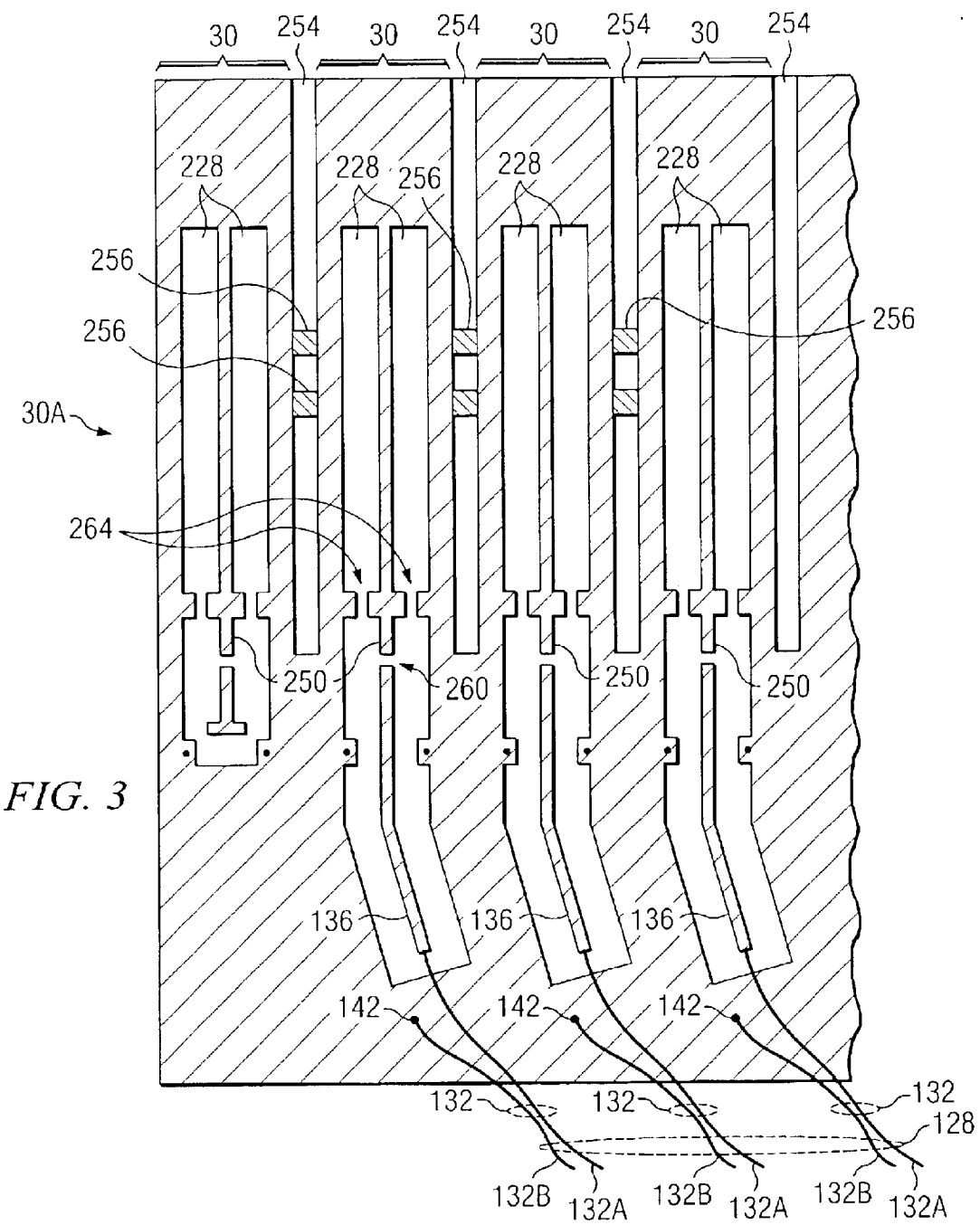
FIG. 3 is a schematic diagram illustrating additional details of one embodiment of the array of sensors shown in FIG. 2A.

FIG. 3 is a schematic diagram illustrating additional details of one embodiment of array 30A of coils 30 shown in FIG. 2A. As shown in FIG. 3, some embodiments of coil 30 defines two separate, elongated loops, as indicated by two openings 228 of each coil 30. Using coils 30 having elongated loops is advantageous in some embodiments because the number of coils 30 that may be positioned within FOV 36 (shown in FIG. 1) is increased. In one embodiment, the loops of each coil 30 share a common conductor 250; however, common conductor 250 may be omitted. In one embodiment, the loops of each coil 30 are planar. Coil 30 having two planar loops that share a common conductor is referred to as a "planar pair." Using planar pair coils 30 is advantageous in some embodiments because they are inherently easier to decouple. Another advantage of using planar pair coils 30 in array 30A is that it is inherently unbalanced with respect to ground, and thus does not require a balun needed in standard MRI coils. "Balun" refers to a balanced-to-unbalanced converter, which is an external circuitry that aids in decoupling coil 30 from one another.

In one embodiment, a particular transmission line 132 of line 128 may be coupled to each coil 30. Each transmission line comprises a signal line 132A and a ground line 132B. For each coil 30, signal line 132A is coupled to a node 136 that is separated from common conductor 250 by a gap 260. Each ground line 132B of each transmission line 132 may be coupled to any portion of the body of sensor system 14, such as a node 142. In one embodiment where the circuitry for tuning sensor system 14 is located in matching/bias box 104 to make the circuitry a component that is separate from sensor system 14, gap 260 may be filled with a conductive material, such as copper. In one embodiment where the circuitry for tuning is a part of sensor system (which may allow matching/bias box 104 to be omitted, in some embodiments), capacitors may be used to bridge gaps 260 and 264.

In one embodiment, gap 254 separates coils 30 from one another for enhanced decoupling. Decoupling may be further enhanced by positioning capacitors 256 across gap 254. In one embodiment, capacitor 256 may be a planar capacitor formed from copper strips, thus maintaining the flat profile of sensor system 14. In one embodiment, as shown in FIG. 3, unused coil 30 may be added to each end of array 30A next to the first coil 30 and the last coil 30 as buffer elements. In some embodiments, more than one unused coil 30 may be added to each end of array 30A. By adding buffer elements, which are unused but matched coils 30 at the edges of array 30A, all of the used coils 30 (the N number of coils 30 between the buffer elements) see nearly identical impedance, thus substantially reducing any edge effects. In this manner, each coil 30 may be matched, tuned and isolated with identical components.

In one embodiment, coils 30 may be formed from either high temperature superconducting material or cryogenically cooled metals to lower the resistance. In one embodiment, such as one shown in FIG. 3, coils 30 may be printed on a flexible substrate, such as a printed circuit board. The size and spacing of coil 30 may vary. In one embodiment, much thinner conductors may be used, with total unit cell (single coil) dimensions on the order of 3 mm to fit thirty-two coils 30 within a 10 cm-wide FOV. For the unbalanced configuration shown in FIG. 3, capacitors 256 may be created by placing copper conductor across gap 254 between coils 30, insulated by a thin dielectric material. In one embodiment, to reduce the width of each coil 30, gap 254 between coils 30 may be removed. This increases coupling, but enables more coils 30 to be packaged in a given dimension of FOV 36. Loop geometry of coils 30 may also vary. Arrays of loops may be used, including one array with the axes of the loops aligned. The return path may be a ground-plane, enabling direct connection to a coaxial transmission line, such as line 128, without the use of a balun. To diminish coupling, shared capacitance would be inserted on the long legs of the loops. This may be done with lumped or planar capacitors.

The high number of coils 30 enables MRI using a single echo acquisition without requiring phase encoding gradients, resulting in faster imaging, reduced gradient switching, lower incidence of nerve stimulation, and reduced blurring due to T2 and T2* decay. In one embodiment, an array 30A of sixty-four coils 30, each 25 cm long and 4 mm wide, would acquire enough image information with a single echo acquisition for an image having a physical dimension of 25 cm×25 cm and 64×256 resolution. Multiple echo acquisitions may also be used to form new images with time resolution better than a millisecond per image. In one embodiment, multiple echo acquisition may be used with array 30A to get extremely high quality images. (For example, 256×256) Typically, images may be confined to regions relatively close to coil 30, which is ideal for implanted coils 30 and imaging typically performed with a surface coil 30. However, some embodiments of the invention may enable the construction of sixty-four or more element arrays 30A of conventional surface coils for volume imaging done using the conventional SMASH or SENSE techniques.

Figure 4A:
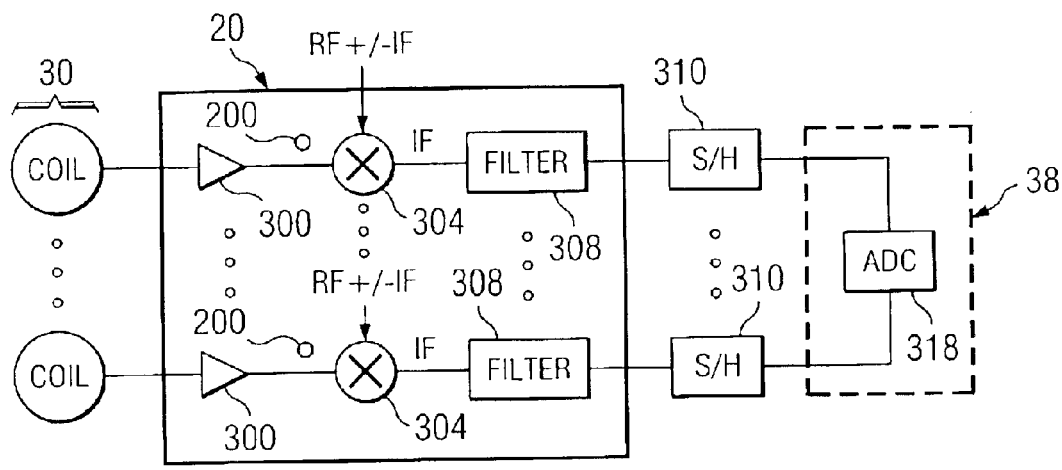
FIGS. 4A and 4B are block diagrams illustrating some embodiments of a receiver channel shown in FIG. 1.
Figure 4B:
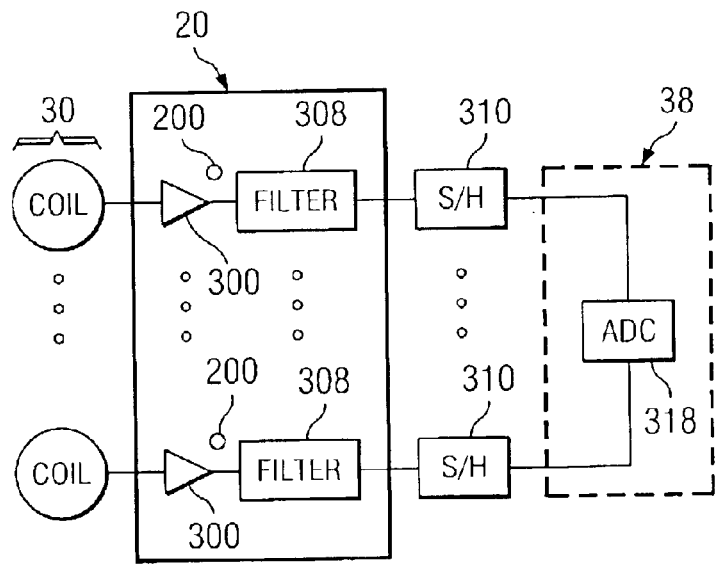

FIGS. 4A and 4B are block diagrams illustrating two embodiments of receiver system 20 of FIG. 2A. FIGS. 4A and 4B are described jointly. As shown in FIG. 4A, in one embodiment, each channel 200 of receiver system 20 comprises an amplifier 300, a mixer 304, and a filter 308 that are coupled to each other. Filter 308 of each channel 200 is coupled to a sample and hold ("S/H") unit 310. S/H unit 310 is coupled to an analog/digital converter ("ADC") board 318 of computer 38. Amplifiers 300, mixers 304, and filters 308 may all reside on one printed circuit board of receiver system 20; however, any suitable implementation method may be used. In some embodiments, mixer 304 may be omitted, as shown in FIG. 4B.

In an illustrative operation, once the signal from preamplifier 18 is received at channel 200 of receiver system 20, the received signal is amplified at amplifier 300. Then the signal is transmitted to mixer 304, where the signal is mixed down to an intermediate frequency ("IF"). For example, in one embodiment, the signal may be mixed down to a 500 kHz IF; however, in one embodiment shown in FIG. 4B, the mixing of the signal may be omitted. In one embodiment, the signal may be amplified again and transmitted to filter 308, where the signal is low-pass filtered to a particular bandwidth. For example, in one embodiment, the signal may be low-pass filtered to a 1 MHz bandwidth. The signal is then sent to S/H unit 310 for capturing the filtered signal so that slow speed digitizers may capture the signal outside their normal range. In some embodiments, S/H unit 310 may reside next to computer 38. The signal is transmitted from S/H unit 310 to ADC board 318 of computer 38, where the signal is digitized. In one embodiment where sixty-four channels are used to accommodate sixty-four coils 30, two thirty-two channel digitizers, such as ICS-645 digitizers, may be used as ADC 318. ICS-645 digitizer is available from Interactive Circuits and Systems Ltd., located in Gloucester, Ontario.

Using one ICS-645 digitizer 318 allows simultaneous sampling of thirty-two channels 200 at 2.5 MHz per channel 200. This provides a 1.25 MHz bandwidth per channel 200 according to the Nyquist theorem, sufficiently broad to enable undersampled demodulation of any pulse sequence currently used for MRI. Two of these boards 310 allow simultaneous sampling from sixty-four coils 30, sufficient to form a 64×256 image. Image reconstruction may be done using any suitable computer or computer system. Although two ICS-645 board 318 are used as an example of ADC board 318 that is operable to receive and process signals from sixty-four coils 30, other types ADCs 318 having analogous capabilities may be used for receiving signals from sixty-four or any other number of coils 30.

By using S/H board 310 that is capable of capturing single samples at the original Larmor frequency and undersampling, a completely digital receiver system 20 may be formed, in one embodiment. A multiplexer (not explicitly shown) may be used to switch between the multiplicity of coils 30 to provide array detection capability. Each element is sampled in turn at the desired undersampling rate. Filtering is done at the Larmor frequency with a bandwidth determined by the actual sampling bandwidth on each channel 200. Multiplexing is performed at the IF. As shown by the layout of components in FIGS. 4A and 4B, filtering is also done at the IF with a bandwidth determined by the actual sampling rate on each channel 200. This is advantageous in some embodiments of the invention because the IF frequency where filters are readily available may be chosen.

In one embodiment, the signal may be mixed down directly to an audio frequency ("AF") such that the entire MR bandwidth is above DC (zero frequency) and fully sample the signal at the Nyquist rate. The multiplexer is built for the AF and filtering may be performed there (in addition to image rejection filtering at the original mixing stage at mixer 304). While this is not an undersampling method, it may avoid the need for multiple analog channels for quadrature demodulation and allows bandpass filtering at an IF or RF stage at the sampling bandwidth.

The techniques described above may be implemented with magnitude reconstruction (for strip encoding with RFE probes) or true phase sensitive demodulation. The physical distribution of components may vary, as determined by one skilled in the art.

FIGS. 5A and 5B are perspective views of sensor system 14 that may be used in conjunction with system 10 of FIG. 1. FIG. 5A shows sensor system 14 having N number of elongated coils 30 that are positioned side-by-side in array 30A. Array 30A defines detection surface 36. Detection surface 36 is the FOV of sensor system 14 because a portion of target surface 34 that overlies or underlies detection surface 36 is imaged using coils 30. In one embodiment, coils 30 are printed on a flexible substrate and may be formed to have the particular profile of target surface 34. For example, to image a patient's brain surface, curved sensor system 14 shown in FIG. 5A may have approximately the same curvature as the patient's brain surface. Thus, once the flexible substrate of sensor system 14 is positioned over target surface 34, such as a portion of a brain surface, the profile of target surface 34 and detection surface 36 are approximately parallel. Although FIG. 5A illustrates a curved detection surface 36, detection surface 36 may be formed in any other shape. Detection surface 36 may also have any size to suitably cover the size of the particular target surface 34, as determined by one skilled in the art.

Referring to FIG. 5B, sensor system 14 is positioned near a tip 354 of a catheter 350. In this embodiment, sensor system 14 is wrapped around the shaft of catheter 350 to form a cylinder so that coils 30 are facing outward from catheter 350 to receive image information. In one embodiment, to image the inner wall of a patient's throat, cylindrical sensor system 14 shown in FIG. 5B may have approximately the same curvature as the patient's throat. Thus, once catheter 350 is inserted into the throat, sensor system 14 is positioned so that the profile of target surface 34, such as the inner wall of the throat, and detection surface 36 are approximately parallel. Cylindrical sensor system 14 for catheter 350 may be constructed by conforming planar sensor system 14 that is fabricated on a flexible circuit board around the surface of catheter 350. The inside of catheter 350 may contain line 128 having a plurality of transmission lines, each transmission line corresponding to particular coil 30 of sensor system 14. Signals may be collected from a cylindrical region immediately outside catheter 350, such as a blood vessel or urethra, or standard tissue in the case of magnetic resonance guided thermal therapy.

FIG. 6 is a flowchart illustrating one embodiment of a method 400 for MRI. A portion or all of method 400 may be performed using system 10. Although method 400 is described is being performed using system 10 for illustrative purposes, method 400 may be performed using other suitable systems and/or devices. Method 400 starts at step 404. At step 408, a detection surface, such as detection surface 36, is provided. Detection surface 36 is defined by array 30A of sensors, such as coils 30. In essence, detection surface 36 defines the FOV. In one embodiment, a number of coils 30 equal to N forms array 30A. In one embodiment, sensors 30 are positioned side-by-side; however, depending on the desired geometry of detection surface 36, other positioning techniques may be used. At step 410, detection surface 36 is positioned over target surface 34 so that detection surface 36 is approximately parallel to target surface 34.

Steps 414 through 428 is performed for each sensor 30. At step 414, an RF signal is transmitted from sensor 30 to the corresponding portion 34A of target surface 34; however, step 414 may be omitted where a different source is used to excite target surface 34. For example, where a loop (not explicitly shown) that encompasses array 30A of sensors 30 is used to transmit RF signals to all of target surface 34, step 414 may be omitted. At step 418, echo signal 210 is received from the corresponding portion 34A of target surface 34 at the sensor 30. Echo signal 210 indicates image information concerning the corresponding portion 34A of target surface 34. At step 420, the received echo signal 210 is isolated to the particular sensor 30. At step 424, a signal generated in response to receiving the echo signal is transmitted from the sensor 30 to one corresponding channel 200 of receiver system 20 over lines 128, 130, and 138. Receiver system 20 processes the signal for digitization. At step 428, the signal processed by receiver system 20 is converted into a discrete image by computer 38.

At step 430, once computer 38 converts the respective signals from sensors 30 into respective discrete images, the discrete images are assembled, according to the relative order of sensors 30 in array 30A, into MR image 48. For example, the discrete image formed using the signal from a first sensor 30 is placed next to the discrete image formed using the signal from a second sensor 30, and the discrete image formed using the signal from a third sensor 30 is placed next to the discrete image of the second sensor 30. Method 400 stops at step 434.

Although some embodiments of the present invention have been described in detail, it should be understood that various changes, substitutions, and alterations can be made hereto without departing from the spirit and scope of the invention as defined by the appended claims.

What is claimed is:

1. A system for magnetic resonance imaging, comprising:

a detection surface defined by an array of at least sixty-four elongated coils that are positioned side-by-side, the detection surface having a particular profile;

wherein each one of the at least sixty-four elongated coils comprises two or more elongated planar loops and is operable to receive image information concerning a particular portion of a target surface by substantially confining to the each one of the at least sixty-four elongated coils magnetic flux that is associated with the particular portion of the target surface, the particular profile of the detection surface approximately the same as a profile of the target surface; and a receiver operable to receive the image information received by the each of the at least sixty-four elongated coils and generate a magnetic resonance image of the target surface, the magnetic resonance image having a resolution of at least sixty-four pixels by M pixels, wherein M is an integer multiple of 64.

2. The system of claim 1, wherein the each one of the at least sixty-four elongated coils is separated from a neighboring one of the at least sixty-four elongated coils by a gap.

3. The system of claim 1, wherein the each one of the at least sixty-four elongated coils is separated from a neighboring one of the at least sixty-four elongated coils by a gap, and further comprising a capacitor positioned to cross the gap.

4. The system of claim 1, wherein the receiver has a particular corresponding channel for the each of the at least sixty-four elongated coils.

5. The system of claim 1, wherein the receiver is operable to generate a magnetic resonance image by converting the received image information received by the each of the at least sixty-four elongated coils into a corresponding discrete image and positioning the corresponding discrete image according to a relative position of the each of the at least sixty-four elongated coils in the array.

6. The system of claim 1, wherein the each one of the at least sixty-four elongated coils is operable to receive the image information by detecting only a single echo signal from the particular portion of the target surface.

7. The system of claim 1, wherein the each one of the at least sixty-four elongated coils is operable to receive the image information by detecting a plurality of echo signals from the particular portion of the target surface.

8. The system of claim 1, wherein the particular profile of the detection surface is flat.

9. The system of claim 1, wherein the particular profile of the detection surface is curved.

10. The system of claim 1, wherein the particular profile of the detection surface is substantially circular and defines a cylindrical body.

11. The system of claim 1, wherein the at least sixty-four coils are used coils, and further comprising two unused coils, wherein the at least sixty-four coils are positioned between the two unused coils.

12. A system for magnetic resonance imaging, comprising:

a detection surface having a particular profile and defined by an array of a number of sensors equal to N, the sensors positioned side-by-side, wherein N is a predetermined integer;

wherein each of the sensors comprises at least one loop and is operable to receive image information concerning a particular portion of a target surface by detecting a single echo signal from the particular portion of the target surface and substantially confining to the each of the sensors magnetic flux that is associated with the particular portion of the target surface, the particular profile of the detection surface approximately the same as a profile of the target surface; and a receiver operable to generate a magnetic resonance image that resembles the target surface by receiving the image information from the each of the sensors, wherein the magnetic resonance image has a resolution of at least N pixels by M pixels and M is an integer.

13. The system of claim 12, wherein the each one of the sensors is a planar pair.

14. The system of claim 12 wherein the each one of the sensors is separated from a neighboring one of the sensors by a gap.

15. The system of claim 12, wherein the each one of the sensors is separated from a neighboring one of the sensors by a gap, and further comprising a capacitor positioned to cross the gap.

16. The system of claim 12, wherein the receiver has a particular corresponding channel for the each of the sensors.

17. The system of claim 12, wherein the receiver is operable to generate a magnetic resonance image by converting the received image information received by the each of the sensors into a corresponding discrete image and positioning the corresponding discrete image according to a relative position of the each of the sensors in the array.

18. The system of claim 12, wherein the each one of the sensors is operable to receive the image information by detecting a plurality of echo signals from the particular portion of the target surface.

19. The system of claim 12, wherein the particular profile of the detection surface is flat.

20. The system of claim 12, wherein the particular profile of the detection surface is curved.

21. The system of claim 12, wherein the particular profile of the detection surface is substantially circular and defines a cylindrical body.

22. The system of claim 12, wherein the sensors are used sensors, and further comprising two unused sensors, wherein the sensors are positioned between the two unused sensors.

23. A method for magnetic resonance imaging, comprising:

providing a detection surface having a particular profile and defined by an array of a number of coils equal to N, the coils positioned side-by-side, wherein N is a predetermined integer, and wherein each one of the coils comprises at least one loop and is operable to receive image information concerning a particular portion of a target surface, the particular profile of the detection surface approximately the same as a profile of the target surface;

initiating a single transmission of an echo signal to the target surface;

in response to the single transmission, receiving, at the each coil, image information concerning the corresponding particular portion of the target surface;

substantially confining magnetic flux associated with the particular portion of the target surface to the each coil;

transmitting the received image information to a receiver;

converting, at the receiver, the image information into a discrete image; and assembling the plurality of discrete images into a magnetic resonance image resembling the target surface, the magnetic resonance image having a resolution of at least N pixels by M pixels, wherein M is an integer.

24. The method of claim 23 wherein the each one of the coils is separated from a neighboring one of the coils by a gap.

25. The method of claim 23, wherein the each one of the coils is separated from a neighboring one of the coils by a gap, and further comprising a capacitor positioned to cross the gap.

26. The method of claim 23, wherein the receiver has a particular corresponding channel for the each of the coils.

27. The method of claim 23, wherein assembling the plurality of discrete images comprises positioning the plurality of discrete images according to the respective relative positions of the each of the coils in the array.

28. The method of claim 23, wherein the particular profile of the detection surface is flat.

29. The method of claim 23, wherein the particular profile of the detection surface is curved.

30. The method of claim 23, wherein the particular profile of the detection surface is substantially circular and defines a cylindrical body.

31. The method of claim 23, wherein the coils are used coils, and further comprising positioning the coils between two unused coils.

* * * * *